United States Patent [19]

Ipri et al.

[11] 4,035,829
[45] July 12, 1977

[54] SEMICONDUCTOR DEVICE AND METHOD OF ELECTRICALLY ISOLATING CIRCUIT COMPONENTS THEREON

[75] Inventors: Alfred Charles Ipri, Princeton, N.J.; John Carl Sarace, Mission Viejo, Calif.

[73] Assignee: RCA Corporation, New York, N.Y.

[21] Appl. No.: 739,823

[22] Filed: Nov. 8, 1976

Related U.S. Application Data

[63] Continuation of Ser. No. 540,443, Jan. 13, 1975, abandoned.

[51] Int. Cl.² .................. H01L 29/78; H01L 27/12
[52] U.S. Cl. .................. 357/49; 307/304; 357/23; 357/41; 357/47; 357/53; 357/59
[58] Field of Search .......... 357/22, 23, 41, 42, 357/47, 49, 53, 59; 307/304

[56] References Cited

U.S. PATENT DOCUMENTS

| 3,035,186 | 5/1962 | Doucette | 357/41 |
|---|---|---|---|
| 3,611,071 | 10/1971 | Augusta | 357/41 |
| 3,676,705 | 7/1972 | Meyer | 357/42 |
| 3,678,347 | 7/1972 | Tulp et al. | 357/23 |
| 3,821,776 | 6/1974 | Hayashi et al. | 357/41 |
| 3,859,716 | 1/1975 | Tihanyi | 357/42 |

OTHER PUBLICATIONS

Bolecky, "CMOSTs on Insulating Substrates," *RCA Review*, June 1970, pp. 372-395.
Lin et al., "Shielded Silicon Gate CMOS," *IEEE Trans. on Electron Devices*, vol. ED-19, No. 11, Nov. 1972, pp. 1199-1207.

*Primary Examiner* — William D. Larkins
*Attorney, Agent, or Firm* — H. Christoffersen; R. P. Williams; T. H. Magee

[57] ABSTRACT

An integrated circuit device comprises a layer of semiconductor material on an insulating substrate. At least two spaced-apart circuit components, such as field-effect transistors, are formed in the layer of semiconductor material. The circuit components are electrically isolated from each other by a method of (1) forming a layer of insulating material over the layer of semiconductor material and between the circuit components, (2) forming a layer of electrically conductive material over the layer of insulating material, and (3) providing bias means between the layer of conductive material and the layer of semiconductor material so as to deplete completely a region in the layer of semiconductor material opposite to the layer of conductive material and between the circuit components.

11 Claims, 12 Drawing Figures

SEMICONDUCTOR DEVICE AND METHOD OF ELECTRICALLY ISOLATING CIRCUIT COMPONENTS THEREON

This is a continuation of application Ser. No. 540,443, filed Jan. 13, 1975, now abandoned.

This invention relates to a semiconductor device and a method of electrically isolating circuit components thereon. More particularly, the invention relates to an integrated circuit device and a method of electrically isolating active components formed in the integrated circuit.

In the manufacture of certain integrated circuits, such as those utilizing epitaxially deposited silicon on a substrate of sapphire, for example, electrical isolation between circuit components of the integrated circuit has been accomplished by forming islands of the silicon layer, whereby the islands are separated by air. Further electrical isolation of the silicon islands has been obtained by covering the islands and the space therebetween with a layer of dielectric material. While such electrical isolation of circuit components in an integrated circuit is satisfactory for some semiconductor devices, isolated islands of semiconductor material present certain problems associated with the edge effects of these islands. For example, the threshold voltage of a field-effect transistor (FET) formed in a semiconductor island can be unstable. Also, the breakdown voltage of such a field-effect transistor is usually lower than when formed in an integrated circuit whose surface is substantially planar. Furthermore, integrated circuits that comprise a plurality of separate islands of semiconductor material on an insulating substrate present serious problems for obtaining good metallization over the edges of the islands without any discontinuities or unwanted excessive resistance in the metallization.

Field plates, or shields, have been used in semiconductor devices comprising bulk silicon, but the effect of the field plates in these devices is primarily to act as channel stoppers. It is not easy to get substantially complete electrical isolation between spaced-apart circuit components in devices formed in bulk silicon because it is not possible to completely deplete the region beneath the field plate in such devices.

In accordance with the present invention, a novel semiconductor device and method of isolating circuit components thereon are provided wherein the structure is planar so that there are no islands to provide step heights which present metal coverage problems. Also, by not utilizing the island-isolation techniques of the prior art, problems relating to the threshold instability and voltage breakdown of the semiconductor device are markedly reduced or substantially eliminated.

The novel semiconductor device comprises a layer of semiconductor material on an insulating substrate. At least two circuit components, each separated from the other, are formed in the layer of semiconductor material. A layer of electrically insulating material is over the layer of semiconductor material, and a layer of electrically conductive material, which functions as a field plate, or shield, is over the layer of insulating material. In accordance with the novel method of the present invention, means are provided to bias the layer of conductive material with respect to the layer of semiconductor material to form a depleted region in the layer of semiconductor material opposite to the layer of conductive material and between the circuit components.

In a preferred embodiment of the novel semiconductor device, the circuit components comprise field-effect transistors, having source and drain regions formed in a layer of single crystal silicon. The layer of silicon is epitaxially deposited on a substrate of sapphire, and the circuit components are adapted to be isolated from each other by a depletion region that extends through the complete thickness of the layer of semiconductor material between the circuit components. The depletion region is obtained by bias means, preferably by electrically connecting a field plate to the layer of semiconductor material and utilizing the voltage provided by the work function between the field plate and the layer of semiconductor material.

The novel semiconductor device and method of making it will be described in conjunction with the following drawings, in which.

Figure 1:
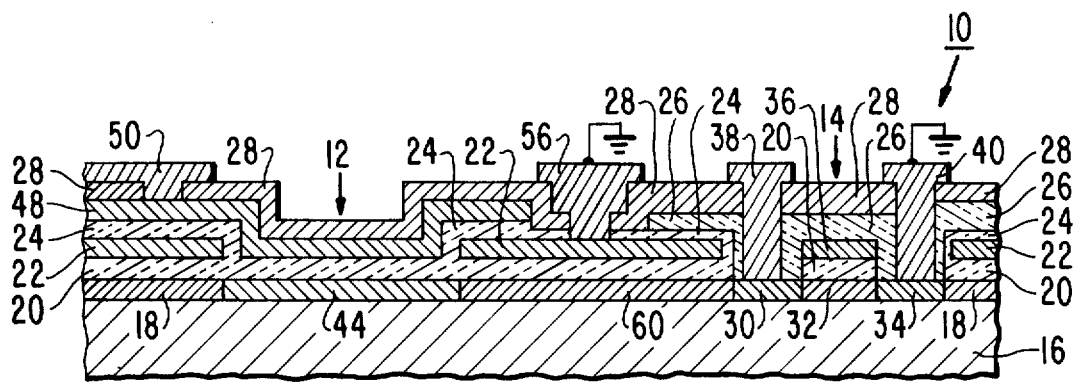
FIG. 1 is a fragmentary cross-sectional view of an embodiment of the novel semiconductor device taken along the plane 1—1 of FIG. 2.
Figure 2:
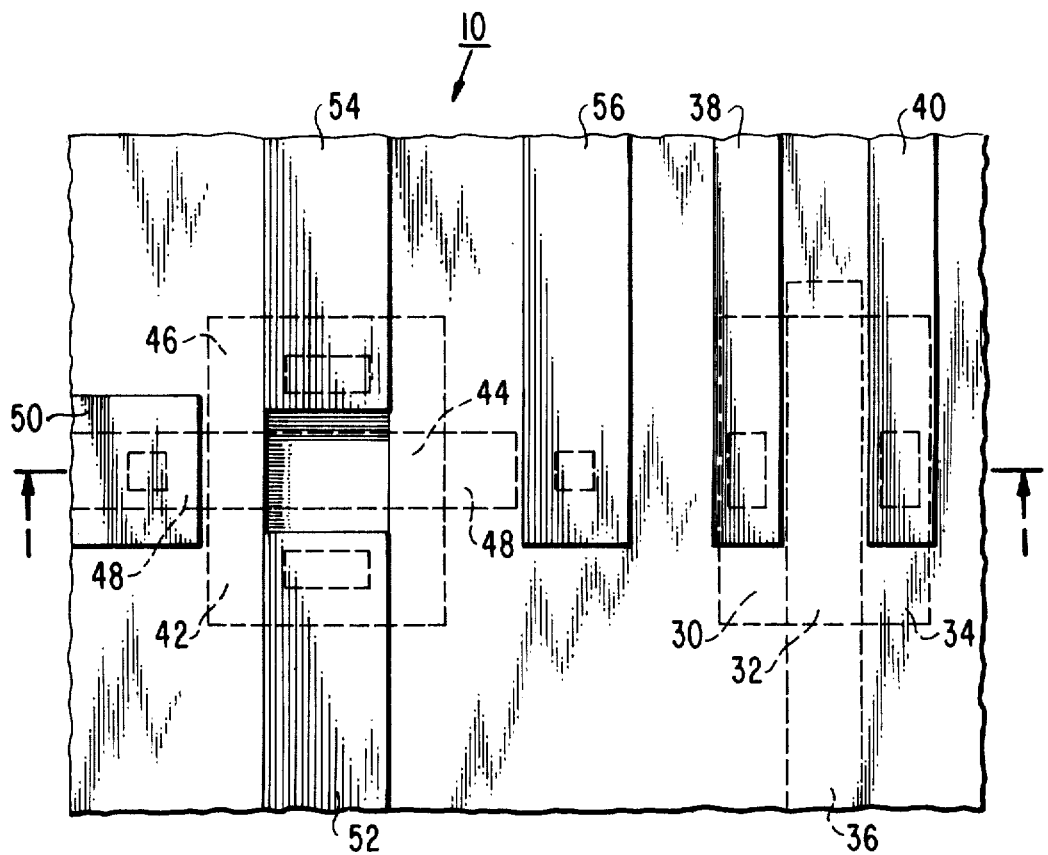
FIG. 2 is a fragmentary plan view of the novel semiconductor device shown in FIG. 1.

Referring now particularly to FIGS. 1 and 2 of the drawing, there is shown one embodiment of the novel semiconductor device 10 of the present invention. The semiconductor device 10 comprises at least two circuit components 12 and 14, illustrated herein as field-effect transistors (FET'S). The semiconductor device 10 comprises an insulating substrate 16, such as sapphire ($Al_2O_3$), spinel, or titanium dioxide, ($TiO_2$), for example. A layer 18 of semiconductor material of one type conductivity such as N- type silicon, germanium, or gallium arsenide, for example, is epitaxially deposited on the substrate 16. Active regions, i.e., regions which are integral parts of circuit components and require electrical isolation such as source, channel, and drain regions of the FETs 12 and 14, are formed in the semiconductor layer 18, as will hereinafter be explained.

A layer 20 of electrically insulating material, such as silicon dioxide, silicon nitride, or aluminum oxide, for example, is over the semiconductor layer 18. An electrically conductive layer 22, such as of doped polycrystalline silicon, often called polysilicon, for example, is over the electrically insulating layer 20, except where the circuit components 12 and 14 are formed. An electrically insulating layer 24, such as of silicon dioxide, for example, is over the conductive layer 22 and around electrical contacts of the circuit components 12 and 14, as best shown in FIG. 1 for the circuit component 14. A doped (phosphorus) polysilicon layer 26 is over the insulating layer 24, except in the region of the component 12, and a doped (boron) layer 28 of polysilicon is over the doped polysilicon layer 26 and over portions of the component 12, as will hereinafter be explained.

The circuit component 14, as shown in FIGS. 1 and 2, is a deep depletion type FET having an N+ source region 30, an N− channel region 32, and an N+ drain region 34. A gate electrode 36 is separated from the channel region 32 by a portion of the insulating layer 20, and electrical contacts 38 and 40 make contact with the source and drain regions 30 and 34, respectively. An electrical contact to the gate electrode 36 is not shown.

The circuit component 12 is a P-channel FET comprising a P source region 42, a N channel region region 44, and a P drain region 46. A gate electrode 48 is separated from the channel region 44 by a portion of the insulating layer 20, as shown in FIG. 1. A metalized contact 50 is connected to the gate electrode 48. Metal contacts 52 and 54 are electrically connected to the source and drain regions 42 and 46, respectively.

Since the source, channel, and drain regions 30, 32, and 34, respectively, of the circuit component 14 are formed in the same semiconductor layer 18 as the source, channel, and drain regions 42, 44 and 46 of the circuit component 12, it is most desirable to separate, that is, to electrically isolate the circuit component 12 from circuit component 14. In acordance with the present invention, a region 60 of the semiconductor layer 18, between the circuit components 12 and 14 of the device 10, is depleted by biasing the conductive layer 22 with respect to the semiconductor layer 18. This may be accomplished under appropriate conditions by connecting the conductive layer 22 to the semiconductor layer 18, as by connecting the metalized contacts 56 and 38 to a common connections, such as ground. Such isolation-producing bias is present to form the depleted region 60, which electrically isolates the circuit components 12 and 14, whenever the circuit components 12 and 14 are supplied with an operating voltage.

Figure 8:
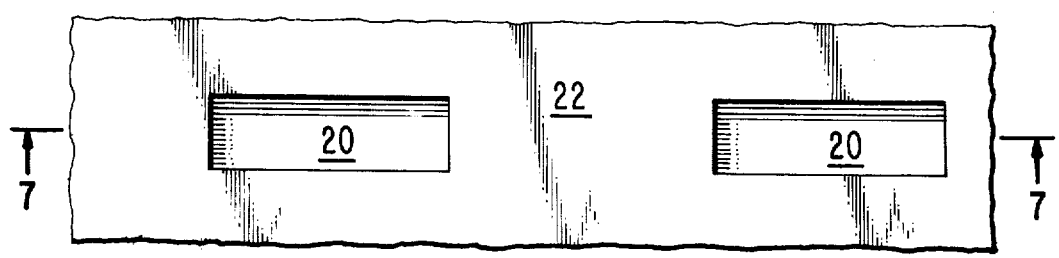
FIGS. 8 and 11 are fragmentary plan views of the novel semiconductor devices in different stages of its construction.

In the preferred embodiment, the electrically conductive layer 22, which forms the field plate, is shaped in a frame-like pattern, as shown in FIG. 8. This frame-like layer 22 has a closed geometry surrounding at least one of the circuit components 12 and 14. According to the present invention, such a frame-like layer 22 may be adapted, upon being biased with respect to the layer 18 of semiconductor material, to completely deplete a corresponding frame-like region 60 in the semiconductor layer 18 opposite thereto and between the circuit components 12 and 14.

The bias means in the novel device 10 is preferably a voltage provided by the work function difference resulting from the different materials of the (field plate) conductive layer 22 and the semiconductor layer 18. Other bias means, however, such as a battery of suitable voltage, may be connected between the conductive layer 22 and the semiconductor layer 18 to completely deplete the region 60 of the semiconductor layer 18 between the circuit components 12 and 14.

Due to the work function difference between the (doped polysilicon) conductive layer 22 and the (single crystal silicon) semiconductor layer 18, an electric field exists at the surface of the semiconductor layer 18. Electrons which were initially present in the regions 60 of the semiconductor layer 18, opposite the conductive layer 22, are affected by the electric field and are swept out, leaving the region 60 depleted of electrons. The depth of the depleted region 60 depends upon the thickness of the semiconductor layer 18 and its doping concentration.

Where the semiconductor layer 18 is relatively thin silicon, that is, less than 1 micron in thickness, the concentration of carriers in the N− type silicon layer 18 is between 1 and $2 \times 10^{15}/cm^3$, and the conductive layer 22 is (boron) doped polysilicon, the region 60 can be completely depleted by connecting the layers 22 and 18 to each other, whereby the circuit components 12 and 14 are substantially electrically isolated from each other.

Figure 3:
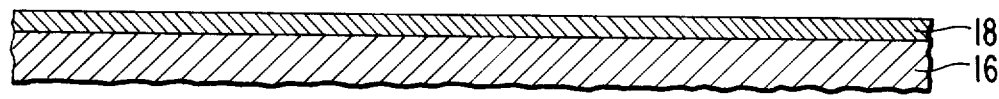
FIGS. 3–7, 9, 10 and 12, are fragmentary cross-sectional views of the novel semiconductor device in different stages of its construction.

The novel semiconductor device 10 can be made as follows: Referring now to FIG. 3, there is shown the insulating substrate 16 which may be wafer of sapphire, spinel, or titanium dioxide, for example, having a thickness of about between 250 $\mu$m and 500 $\mu$m. A layer of semiconductor material, such as N− type silicon, having a carrier concentration of between $1-2 \times 10^{15}/cm^3$ and a thickness of between about 0.5 $\mu$m and 0.7 $\mu$m is epitaxially deposited on the surface of the insulating substrate 16. The semiconductor layer 18 may be doped with either arsenic or phosphorus, for example.

Figure 4:
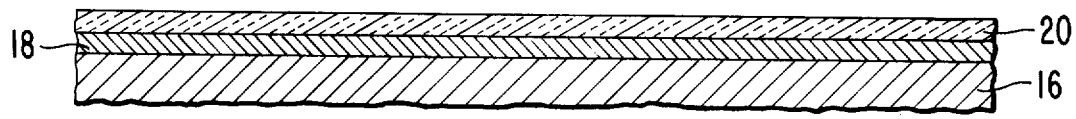

The layer 20 of electrically insulating material is preferably a layer of silicon dioxide which can be grown thermally on the semiconductor layer 18, as by oxidizing the semiconductor layer 18 in steam at a temperature of about 900° C for between 30 and 60 minutes. The insulating layer 20, shown in FIG. 4, should have a thickness of between about 500A and 1,000A.

Figure 5:
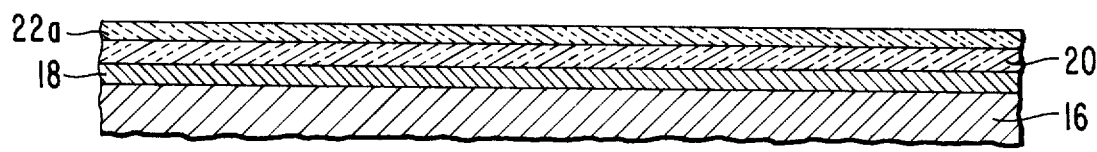
Figure 6:
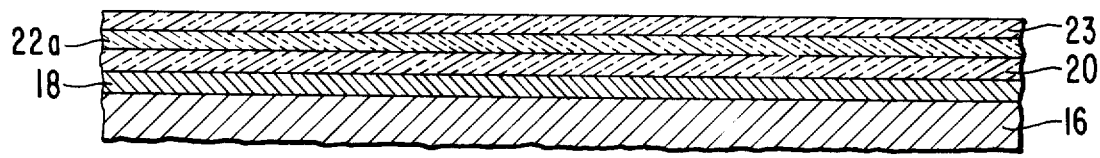

Next, a layer 22a of polysilicon is deposited upon the insulating layer 20, as shown in FIG. 5. The polysilicon layer 22a can be deposited upon the insulating layer 20 by any suitable method, as by the decomposition of silane, $SiH_4$, at a temperature of about 700° C in a chemical vapor deposition system. The thickness of the polysilicon layer 22a is between about 0.1 $\mu$m and 0.5 $\mu$m. Means are provided to dope the polysilicon layer 22a, shown in FIG. 7, to make it conductive. To this end, a layer 23 of P+ (boron) doped glass, as shown in FIG. 6, is deposited over the polysilicon layer 22a. The layer 23 of P+ (boron) doped glass can be deposited by reacting silane ($SiH_4$) and oxygen in the presence of diborane at a temperature of between 320° and 450° C in a chemical vapor deposition process, well-known in the art. The thickness of the layer 23 may be in the neighborhood of about 3,000A and should have a concentration of about $10^{20}/cm^3$.

Figure 7:
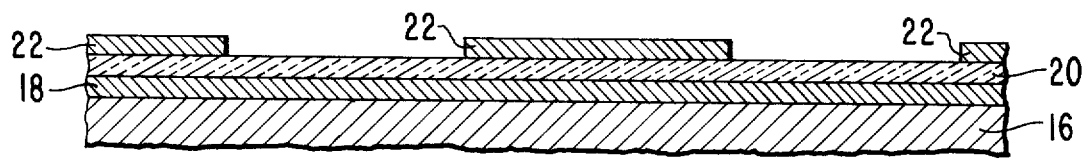

The boron glass layer 23, shown in FIG. 6, is defined with a photoresist, not shown, to form the field plate 22, in the pattern shown in FIG. 7. The defined boron glass layer 23 is then etched as with a buffered HF solution; and the remaining defined boron glass layer 23 is heated for about 10 minutes in helium at a temperature of about 1,050° C to deffuse the boron into the field plate 22. The boron glass 23 is then stripped from the field plate 22, using an HF acid solution. The portion of the polysilicon layer 22 that is not used for the field plate is then removed, as with a solvent which does not substantially attack boron doped silicon, such as a solution of KOH, water, and N-propanol at a temperature of about 70° C.

Figure 9:
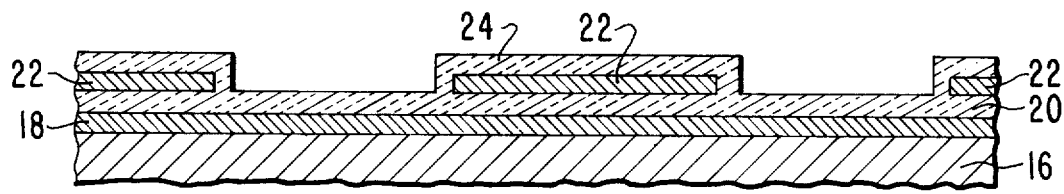
Figure 10:
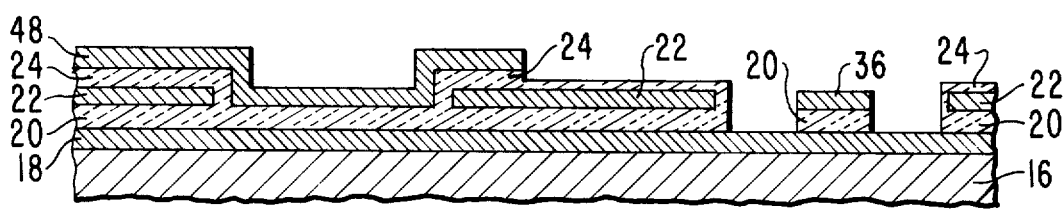
Figure 11:
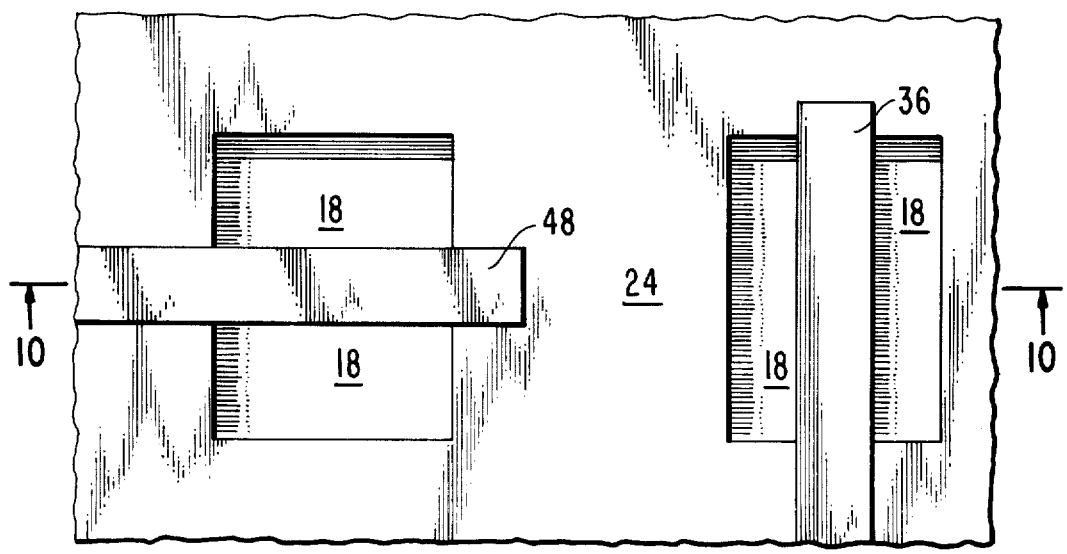

The structure shown in FIG. 7 is now treated to form the gates 36 and 48, of the circuit components 14 and 12, respectively, and to provide means for forming the source and drain regions of these circuit components. To this end, the layer 24 of silicon dioxide, having a thickness of between 500A and 1000A, is formed over the structure shown in FIG. 7, as by heating in steam at 900° C for about 30–60 minutes, to form the structure shown in FIG. 9. A polysilicon layer (not shown) is deposited over the layer 24 and a boron doped glass layer (not shown) is deposited over the last-mentioned polysilicon layer in the manner previously described. The boron doped layer is then covered with a photoresist which, in turn, is defined to form the gates 36 and 48 by photolithographic means well known in the art. The boron glass is now etched, leaving boron glass portions over the polycrystalline layer which will be the gates 36 and 48. The structure is now heated to diffuse boron into the polysilicon layer to form the gates 36 and 48. The remaining boron glass and portions of the polysilicon layer, other than the gates 36 and 48 of the circuit components 14 and 12, respectively, are now etched away. Portions of the insulating layer 20 are next etched away to expose portions of the surface of the semiconductor layer 18 for diffusing impurities therein to form the source and drain regions of the circuit components 12 and 14, as shown in FIG. 10.

Figure 12:
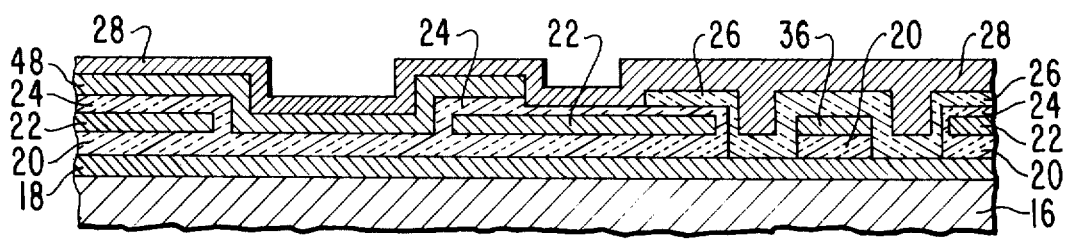

The source and drain regions 30 and 34 of the component 14 (FIG. 1) are now formed by depositing a layer 26 (FIG. 12) of phosphorus doped silicon dioxide over exposed portions of the surface of the semiconductor layer 18. The phosphorus doped layer 26 is deposited in a chemical vapor deposition system from a mixture of silane and $PH_3$ at a temperature of between 320° and 450° C to a thickness of about 1,000A. The concentration of phosphorus in the doped silicon dioxide layer 26 is about $10^{19}/cm^3$. The phosphorus doped layer 26 is defined with photoresist over the source and drain regions 30 and 34. The layer 28 of boron silicon dioxide is now deposited over the structure shown in FIG. 12 for the purpose of forming the source and drain regions 42 and 46 of the component 12, as shown in FIG. 2. The boron doped layer 28 and the phosphorus doped layer 26 are then heated to a temperature of about 1050° C for about 15 minutes in helium to diffuse the boron and phosphorus into the semiconductor layer 18, simultaneously whereby to form the source and drain regions 42 and 46 of the device 12 and the source and drain regions 30 and 34 of the device 14.

Contact regions to the sources and drains of the circuit components 12 and 14 and also to the field plate 22 are formed by photolithographic means, using a photoresist and a buffered HF for etching, in a manner well-known in the art. Metal contacts 38 and 40 for source and drain regions of the circuit component 14 and metal contacts 52 and 54 for the source and drain regions 42 and 46 of the circuit component 12, as well as a metal contact 56 for the field plate 22 are formed by the vacuum evaporation of a metal, such as aluminum, in a manner well-known in the art.

While the novel semiconductor device 10 has been described with components 12 and 14 formed in the semiconductor layer 18 of N− type semiconductor material, it is within the contemplation of the present invention to include semiconductor devices with components formed in P type semiconductor material as where the conductive layer 22 can be phosphorus doped polysilicon or a metal. If the conductive layer 22 is a metal, then the bias applied between the conductive layer 22 and the semiconductor layer 18 may be other than zero, that is, either a positive or a negative potential in order to effect the completely depleted region 60 within the semiconductor layer 18.

What is claimed is:
1. A semiconductor device comprising:
   an insulating substrate,
   a layer of semiconductor material of one type conductivity on said insulating substrate,
   two circuit components, each having an active region of said one type conductivity separated from the other by only semiconductor material of said one type conductivity, formed in said layer of semiconductor material,
   a layer of electrically insulating material over said layer of semiconductor material and between said active regions,
   a layer of electrically conductive material over said layer of insulating material, and
   means to bias said layer of conductive material with respect to said layer of semiconductor material to form a depletion region in said layer of semiconductor material opposite to said layer of conductive material and between said active regions, said biasing means comprising means for electrically connecting said layer of electrically conductive material to said layer of semiconductive material opposite thereto.
2. A semiconductor device as described in claim 1, wherein:
   said insulating substrate comprises a material chosen from the group consisting of sapphire, spinel, and titanium dioxide,
   said layer of semiconductor material is one consisting of silicon, germanium, and gallium arsenide,
   said layer of insulating material is one chosen from the group consisting of silicon dioxide, silicon nitride, and aluminum oxide,
   said layer of electrically conductive material is a material chosen from the group consisting of a metal and doped polysilicon, and
   said means to bias said layer of conductive material with respect to said layer of semiconductor material comprises means to completely deplete the semiconductor material between said regions.
3. A semiconductor device as described in claim 1, wherein:
   said substrate comprises sapphire, and
   said circuit components comprise field effect transistors.
4. A semiconductor device as described in claim 1, wherein:
   said connecting means comprises an electrical connection from both said conductive layer and said semiconductor layer to a common connection.
5. A method of electrically isolating two circuit components formed in a layer of semiconductor material on an insulating substrate, said method comprising the steps of:
   forming a layer of insulating material over said layer of semiconductor material and between said two circuit components,
   forming a layer of electrically conductive material over said layer of insulating material, and
   applying a bias between said layer of conductive material and said layer of semiconductor material to completely deplete a region in said layer of semiconductor material opposite to said layer of conductive material and between said circuit components, said applying step being performed by electrically shorting said layer of electrically conductive material to said layer of semiconductive material opposite thereto.
6. A method of electrically isolating two circuit components as described in claim 5, wherein:
   said layer of semiconductor material is a material selected from the group consisting of silicon, germanium, and gallium arsenide, and said layer of insulating material is a material selected from the group consisting of silicon dioxide, silicon nitride, and aluminum oxide.

7. A method of electrically isolating two circuit components as described in claim 5, wherein:
said substrate is one selected from the group consisting of sapphire, spinel, and titanium oxide,
said layer of insulating material is silicon dioxide, and
said layer of conductive material is doped polysilicon.

8. A method of isolating two circuit components as described in claim 5, wherein:
said layer of conductive material is one chosen from the group consisting of a metal and doped polysilicon.

9. A semiconductor device comprising:
an insulating substrate,
a layer of semiconductor material of one type conductivity on said insulating substrate,
at least two circuit components, each separated from the other, formed in said layer of semiconductor material,
a layer of electrically insulating material over said layer of semiconductor material,
a frame-like layer of electrically conductive material over said layer of insulating material, said frame-like layer having a closed geometry surrounding one of said circuit components and being adapted, upon being biased with respect to said layer of semiconductor material, to completely deplete a region in said semiconductor layer opposite thereto and between said circuit components, and
means for electrically connecting said layer of electrically conductive material to said layer of semiconductor material opposite thereto.

10. A semiconductor device as defined in claim 9 wherein said connecting means comprises an electrical connection from both said conductive layer and said semiconductor layer to a common connection.

11. A semiconductor device as defined in claim 10 wherein:
said insulating substrate comprises a material chosen from the group consisting of sapphire, spinel, and titanium dioxide,
said layer of semiconductor material is one consisting of silicon, germanium, and gallium arsenide,
said layer of insulating material is one chosen from the group consisting of silicon dioxide, silicon nitride, and aluminum oxide, and
said layer of electrically-conductive material is a material chosen from a group consisting of a metal and doped polysilicon.

* * * * *